US010826466B1

(12) United States Patent
Calcagno et al.

(10) Patent No.: US 10,826,466 B1
(45) Date of Patent: Nov. 3, 2020

(54) DIGITAL OUTPUT BUFFER CIRCUITS WITH REDUCED INPUT/OUTPUT DELAY

(71) Applicant: STMicroelectronics S.r.l., Agrate Brianza (IT)

(72) Inventors: Giuseppe Calcagno, Messina (IT); Salvatore Difazio, Catania (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/583,985

(22) Filed: Sep. 26, 2019

(51) Int. Cl.
*H03B 1/00* (2006.01)
*H03K 3/00* (2006.01)
*H03K 3/012* (2006.01)
*H03K 5/04* (2006.01)
*H03K 17/687* (2006.01)

(52) U.S. Cl.
CPC .............. *H03K 3/012* (2013.01); *H03K 5/04* (2013.01); *H03K 17/687* (2013.01)

(58) Field of Classification Search
CPC ....... H03K 19/00361; H03K 19/00315; H03K 19/00384; H04L 25/028; H04L 25/0272
USPC .................................................. 327/108, 112
See application file for complete search history.

(56) References Cited

U.S. PATENT DOCUMENTS

| 5,317,206 | A | * | 5/1994 | Hanibuchi | ....... H03K 19/00361 326/21 |
| 5,568,081 | A | | 10/1996 | Lui et al. | |
| 5,587,678 | A | * | 12/1996 | Dijkmans | ........ H03K 19/00361 326/26 |
| 5,973,512 | A | | 10/1999 | Baker | |
| 7,656,201 | B2 | * | 2/2010 | Kanzaki | ........... H03K 17/04206 327/108 |
| 8,138,806 | B2 | * | 3/2012 | Wadekar | ............. H04L 25/0272 327/108 |

* cited by examiner

*Primary Examiner* — Anh Q Tra
(74) *Attorney, Agent, or Firm* — Slater Matsil, LLP

(57) ABSTRACT

A half buffer circuit includes a current source coupled to a first node, a ground connection coupled to a second node, a feedback capacitor coupled between the first node and an output of the half buffer circuit, a transconductor element comprising a first input/output, a second input/output, and a transconductor element control input, and a switch network coupled between the first node and the second node. The first input/output is coupled to the output of the half buffer circuit. The second input/output is coupled to a ground connection. The switch network includes a first switch coupled between the first node and the second node, a second switch coupled between the first node and the transconductor element control input, and a third switch coupled between the second node and the transconductor element control input.

20 Claims, 6 Drawing Sheets

DIGITAL OUTPUT BUFFER CIRCUITS WITH REDUCED INPUT/OUTPUT DELAY

TECHNICAL FIELD

The present invention relates generally to digital output buffer circuits, and, in particular embodiments, to digital output buffer circuits with reduced input/output delay.

BACKGROUND

Conventional digital output buffer circuits are sensitive to loading capacitance and supply voltage variations. The slew rate of an output buffer circuit can be controlled in order to remove this undesirable sensitivity. For example, conventional digital output buffer circuits often have load-independent slewing circuits which introduce a large propagation delay. A feedback capacitor in the slew-rate controller circuitry is used to sense the slew-rate of the output voltage and compare it against that of a reference signal. The large buffer propagation delay time is due to the complete charging and discharging of this feedback capacitor during commutation. However, the speed of an output buffer circuit is also important, such as in so-called zero delay input/output output buffer circuits, for example. Further, in order to reduce electromagnetic emission of the output voltage, slew can be limited or sometimes programmed. Therefore, it may be desirable to reduce charging and/or discharging of a feedback capacitor in order to reduce or eliminate input/output delay time of an output buffer circuit.

SUMMARY

In accordance with an embodiment of the invention, a half buffer circuit includes a current source coupled to a first node, a ground connection coupled to a second node, a feedback capacitor coupled between the first node and an output of the half buffer circuit, a transconductor element comprising a first input/output, a second input/output, and a transconductor element control input, and a switch network coupled between the first node and the second node. The first input/output is coupled to the output of the half buffer circuit. The second input/output is coupled to a ground connection. The switch network includes a first switch coupled between the first node and the second node, a second switch coupled between the first node and the transconductor element control input, and a third switch coupled between the second node and the transconductor element control input.

In accordance with another embodiment of the invention, an output buffer circuit includes a first input node, and an output node, a negative-slewing half buffer circuit coupled between a current source and a ground connection. The negative-slewing half buffer circuit includes a first output transistor coupled to the output node, a first feedback capacitor coupled to the output node, and a first switch network. The first switch network includes a first current path between the current source and the ground connection. The first switch network further includes a second current path between the current source and the ground connection. The first current path is configured to allow current to flow when the first input node receives a logical high signal voltage. The second current path is configured to allow current to flow when the output node outputs a logical low signal voltage.

In accordance with still another embodiment of the invention, a method of operating an output buffer circuit includes providing a logical high signal voltage to a first switch network of a negative-slewing half buffer circuit of the output buffer circuit, partially charging a first feedback capacitor of the negative-slewing half buffer circuit to a first partially charged steady state voltage using a supply voltage and in response to providing the logical high signal voltage to the first switch network, outputting the logical high signal voltage at an output of the output buffer circuit after providing the logical high signal voltage, switching the logical high signal voltage at the first switch network to a logical low signal voltage, partially discharging the first feedback capacitor to a second partially charged steady state voltage in response to switching the logical high signal voltage at the first switch network to the logical low signal voltage, and outputting the logical low signal voltage at the output of the output buffer circuit after switching the logical high signal voltage to the logical low signal voltage. The first partially charged steady state voltage is less than the supply voltage. The second partially charged steady state voltage is greater than a ground voltage.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
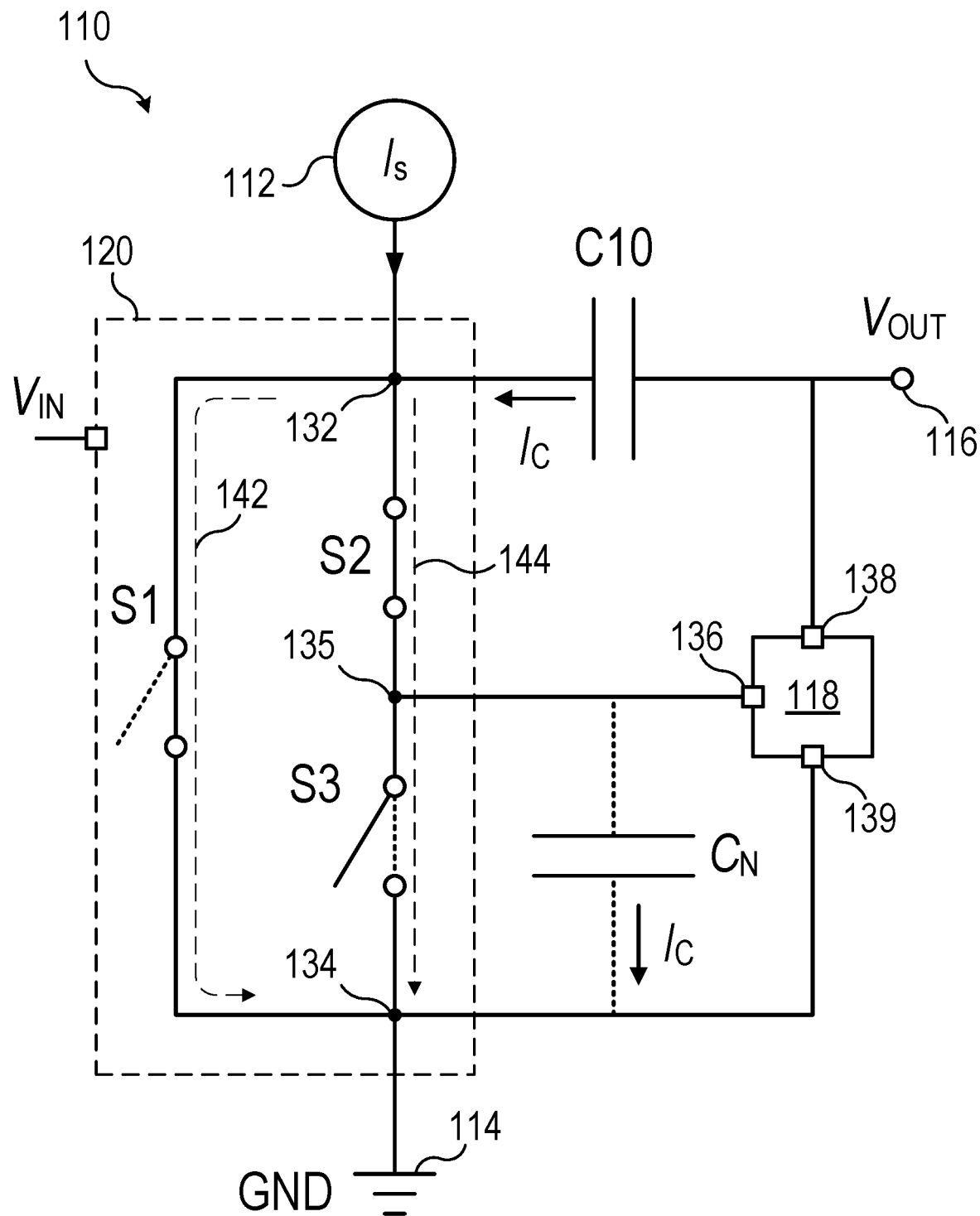
FIG. 1 illustrates a schematic circuit diagram of an example half buffer circuit usable in an output buffer circuit in accordance with an embodiment of the invention.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Embodiment output buffer circuits as described herein may advantageously facilitate reduced or eliminated delay between the input signal and the output during commutations. Embodiment output buffer circuits may also beneficially produce output slew rates (rise times) that are relatively or entirely insensitive to capacitance loading. Output slew rates of embodiment output buffer circuits may also have the advantage of being relatively or entirely insensitive to supply voltage variation. A combination of the foregoing advantages may in itself be considered an advantage as conventional output buffer circuit configurations disadvantageously require a trade-off between input/output delay and insensitivity to loading capacitance/supply variations.

The embodiment buffer circuits described herein may include a pair of half buffer circuits. A single embodiment half buffer circuit may be conceptually divided into two parts. The first part includes a switch network and the second part includes an output device (e.g., a transistor). The switch network includes a first switching device coupled between a first node and a control input (e.g., a gate) of the output device and a second switching device coupled between the control input and a second node. The first node is coupled to a current supply while the second node is coupled to either a supply voltage or a ground voltage.

A feedback capacitor is connected between the output voltage and the first node. The feedback capacitor is used to sense the slope of the output voltage by comparing it against that of a reference signal so that the error signal can alter the control voltage at the control input of the output device. The switch network also includes a third switching device that is used to divert the current flow from the first switching device to the third switching device. In this way the feedback capacitor is advantageously not fully charged or discharged (e.g., to the supply voltage or the ground voltage respectively), but instead remains close to a predetermined reference control voltage at the control input of the output device.

Embodiments provided below describe various output buffer circuits and methods of reducing input/output delay time of output buffer circuits, and in particular, output buffer circuits that reduce charging and/or discharging of feedback capacitors in order to reduce input/output delay time. The following description describes the embodiments. An embodiment half buffer circuit is described using FIG. 1. An embodiment CMOS negative-slewing half buffer circuit is described using FIG. 2. An embodiment timing diagram of a half buffer circuit is described using FIG. 3. An embodiment CMOS output buffer circuit is described using FIG. 4.

FIG. 1 illustrates a schematic circuit diagram of an example half buffer circuit usable in an output buffer circuit in accordance with an embodiment of the invention. Although reference is made to circuits in the following, a collection of circuit elements may also be referred to as a circuit block, a module, an electronic device, and the like. Any connections between circuits, to a voltage supply, or to a ground connection as shown in FIG. 1 may represent a single connection or multiple connections. The terms "coupled to" and "connected to" are intended to encompass direct and indirect electrical and/or physical connections between circuit elements.

Referring to FIG. 1, a half buffer circuit no includes a current source 112 coupled to a switch network 120 at a first node 132 and a ground voltage connection 114 coupled to the switch network 120 at a second node 134. The ground voltage connection 114 may be coupled to a ground voltage GND. The ground voltage connection 114 may be an earth ground connection or a reference ground connection. For example, the ground voltage connection 114 may be a common return path for the half buffer circuit 110.

The switch network 120 includes a first switching device S1 coupled between the first node 132 and the second node 134. The path through the first switching device S1 is a first current path 142 from the first node 132 to the second node 134. The switch network 120 also includes a second switching device S2 coupled between the first node 132 and a third node 135 and a third switching device S3 coupled between the third node 135 and the second node 134. The path through the second switching device S2 and the third switching device S3 is a second current path 144 from the first node 132 to the second node 134. A switching device may be implemented with any suitable device such as a transistor, for example. In various embodiments, one or more of the switching devices are metal-oxide-semiconductor field-effect transistors (MOSFETs). In various embodiments, one or more of the switching devices are bipolar junction transistors (BJTs). Other suitable switching devices may also be apparent to those of skill in the art.

The half buffer circuit no further includes a capacitor C10 coupled between the first node 132 and an output 116. An output device 118 includes a control input 136 coupled to the third node 135. The output device 118 of the half buffer circuit no also includes a first input/output 138 coupled to the output 116 and a second input/output 139 coupled to the ground voltage connection 114 (e.g., through the second node 134 as shown). A parasitic capacitance $C_N$ may exist between the control input 136 and the second input/output 139.

During operation, the switch network 120 of the half buffer circuit no receives an input voltage VIN, an output voltage at the output 116, and a reference voltage $V_{REF}$ by which the state of the switches in the circuit 120 can be changed. The half buffer circuit no controls slewing of the output voltage $V_{OUT}$ between a logical high signal voltage and a logical low signal voltage. In one embodiment, the half buffer circuit no is a negative-slewing half buffer circuit, as illustrated. Alternatively, the half buffer circuit no is a positive-slewing half buffer circuit. For example, the ground voltage connection 114 may be substituted with a supply voltage, the direction of the current source 112 may be reversed, and the half buffer circuit 110 may be a positive-slewing half buffer circuit.

The current source 112 generates a supply current $I_s$ at the first node 132. When the input voltage VIN is at a first logical level, the third switching device S3 is closed and the half buffer circuit 110 is in an off state. Following the off state, the input voltage $V_{IN}$ may be switched (i.e. changed) from the first logical level to a second logical level. The second logical level may be higher or lower than the first logical level and may depend on whether the half buffer circuit no is a negative-slewing half buffer circuit or a positive-slewing half buffer circuit. Once the input voltage $V_{IN}$ changes from the first logical level to the second logical level, the half buffer circuit no may successively progress through a precharge state and a slewing state, and then equilibrate in an on state.

During the precharge state, the first switching device S1 and the third switching device S3 are both open while the second switching device S2 is closed. In this configuration, a charging current $I_C$ flows through the second switching device S2 between the capacitor C10 and the control input 136 of the output device 118. The charging current $I_C$ at the control input 136 allows a current to flow through the output device 118 between the first input/output 138 and the second input/output 139 and the half buffer circuit no enters the slewing state. Since the charging current $I_C$ flows through the second switching device S2, the second switching device S2 may be considered a flow control switch.

Once the output device 118 is turned on, the output device may function as a transconductor element where a control input voltage at the control input 138 is changed until the slope error of the output voltage $V_{OUT}$ at the output 116, measured as the difference of the supply current $I_s$ and the current through the capacitor C10, is canceled out. At or near the end of the slewing state, the first switching device S1 is turned on which diverts the supply current $I_s$ through the third switching device S1 along the first current path 142.

After the output voltage $V_{OUT}$ has been slewed to the second logical level, the half buffer circuit no is in the on state. In the on state, the first switching device S1 is closed and the third switching device S3 is open which allows the supply current $I_s$ to flow along the first current path 142 and advantageously prevents the feedback capacitor C10 from fully charging (or discharging). Therefore, during the on state, the feedback capacitor C10 is at a partially charged steady voltage that is somewhere between the supply voltage and the ground voltage supplied to the half buffer circuit no. Due to the role of the first switching device S1 in diverting excess current while in the on state, the first switching device S1 may be considered an overflow switch.

While the half buffer circuit no is in the on state, the input voltage may again be switched, this time from the second logical level to the first logical level. The half buffer circuit no may then enter a resetting state during which the third switching device S3 is turned on. At or near the beginning of the resetting stage, the first switching device S1 is turned off. Another half buffer circuit may control the slewing of the output voltage $V_{OUT}$ from the second logical level back to the first logical level during the resetting stage.

After the output voltage $V_{OUT}$ has been slewed to the first logical level, the half buffer circuit no is in the off state, the first switching device S1 is off and both the second switching device S2 and the third switching device S3 are turned on. The third switching device S3 may be considered a transition switch because of its toggling functionality between the on state and the off state. The supply current $I_s$ flows along the second current path 144 through the second switching device S2 and the third switching device S3 and advantageously prevents the feedback capacitor C10 from fully charging (or discharging). Therefore, in the off state, the feedback capacitor C10 is at another partially charged steady voltage that is somewhere between the supply voltage and the ground voltage supplied to the half buffer circuit no and may be greater than or less than the on state partially charged steady voltage depending on whether the half buffer circuit no is a negative-slewing half buffer circuit or a positive-slewing half buffer circuit.

Figure 2:
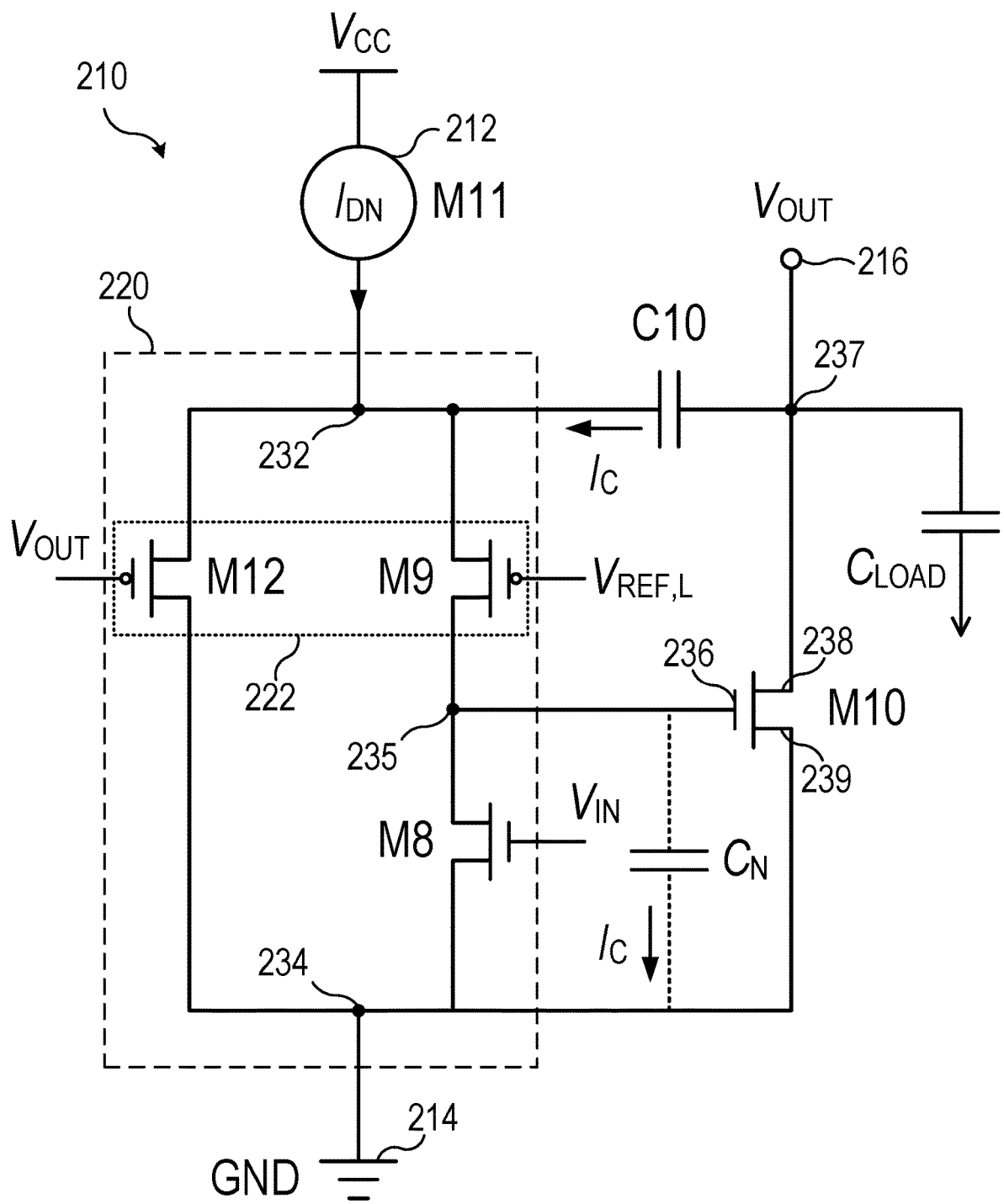
FIG. 2 illustrates a schematic circuit diagram of an example CMOS negative-slewing half buffer circuit usable in an output buffer circuit in accordance with an embodiment of the invention.

FIG. 2 illustrates a schematic circuit diagram of an example CMOS negative-slewing half buffer circuit usable in an output buffer circuit in accordance with an embodiment of the invention. The CMOS negative-slewing half buffer circuit of FIG. 2 may be a specific implementation of the half buffer circuit of FIG. 1, for example.

Referring to FIG. 2, a negative-slewing half buffer circuit 210 includes a current source 212 coupled to a switch network 220 at a first node 232 and a ground voltage connection 214 coupled to the switch network 220 at a second node 234. As shown, the current source 212 may be coupled to a supply voltage $V_{CC}$ while the ground voltage connection 214 may be coupled to a ground voltage GND. In one embodiment, the current source 212 is a transistor M11 as labeled.

The switch network 220 includes a first p-type transistor M12 coupled between the first node 232 and the second node 234 and a second p-type transistor M9 coupled between the first node 232 and a third node 235. The first p-type transistor M12 and the second p-type transistor M9 are arranged as a differential pair of transistors 222. The switch network 220 also includes an n-type transistor M8 coupled between the third node 235 and the second node 234. The first p-type transistor M12, the second p-type transistor M9, and the n-type transistor M8 may be specific implementations of the first switching device S1, the second switching device S2, and the third switching device S3 of FIG. 1, respectively.

The negative-slewing half buffer circuit 210 further includes a capacitor C10 coupled between the first node 232 and a fourth node 237 which is coupled to an output 216 and a capacitive load $C_{LOAD}$. An n-type output transistor M10 includes a gate 236 coupled to the third node 235. The n-type output transistor M10 also includes a drain 238 and source 239 coupled to the fourth node 237 and the second node 234 respectively. A parasitic capacitance $C_N$ may exist between the gate 236 and the source 239. The n-type output transistor M10 may be a specific implementation of the output device 118 of FIG. 1 with the gate 236, drain 238, and source 239 respectively corresponding to the control input 136, first input/output 138, and second input/output 139.

The switch network 220 receives an input voltage $V_{IN}$ at the gate of the n-type transistor M8. The input voltage $V_{IN}$ may be a logical signal voltage (e.g., a logical high signal voltage or a logical low signal voltage). The input voltage $V_{IN}$ at the gate of the n-type transistor M8 may toggle the state of the negative-slewing half buffer circuit 210 between the on state and the off state, triggering the intermediate states in between, as previously described.

The gate of the first p-type transistor M12 is connected to the output voltage $V_{OUT}$. Specifically, the output voltage $V_{OUT}$ is generated at the output 216 of the negative-slewing half buffer circuit 210 and then fed back to the gate of the first p-type transistor M12. A reference voltage $V_{REF,L}$ is connected to the gate of the second p-type transistor M9. The reference voltage $V_{REF,L}$ may be a constant reference voltage between the supply voltage $V_{CC}$ and the ground voltage GND. In one embodiment, the reference voltage $V_{REF,L}$ is closer to the ground voltage GND than the supply voltage $V_{CC}$. In this case, the reference voltage $V_{REF,L}$ may be considered a low reference voltage.

The differential pair of transistors 222 controls the current flow through the first p-type transistor M12 and the second p-type transistor M9 using the relative values of the reference voltage $V_{REF,L}$ and the output voltage $V_{OUT}$. Since the first p-type transistor M12 and the second p-type transistor M9 are p-type, current may flow entirely through the second p-type transistor M9 when the output voltage $V_{OUT}$ is sufficiently greater than the reference voltage $V_{REF,L}$ and may flow entirely through the first p-type transistor M12 when the output voltage $V_{OUT}$ is sufficiently less than the reference voltage $V_{REF,L}$. A crossover region may exist when the gate voltages of the differential pair of transistors 222 are relatively close in value, but this voltage range may be small.

The current flow control afforded by the differential pair of transistors 222 may advantageously control the timing of the current flow through the first p-type transistor M12. For example, during the slewing state, the first p-type transistor M12 may remain off until the output voltage $V_{OUT}$ drops sufficiently below the reference voltage $V_{REF,L}$. Similarly, the first p-type transistor M12 may initially be on during the resetting state and may turn off once the output voltage $V_{OUT}$ rises sufficiently above the reference voltage $V_{REF,L}$.

Figure 3:
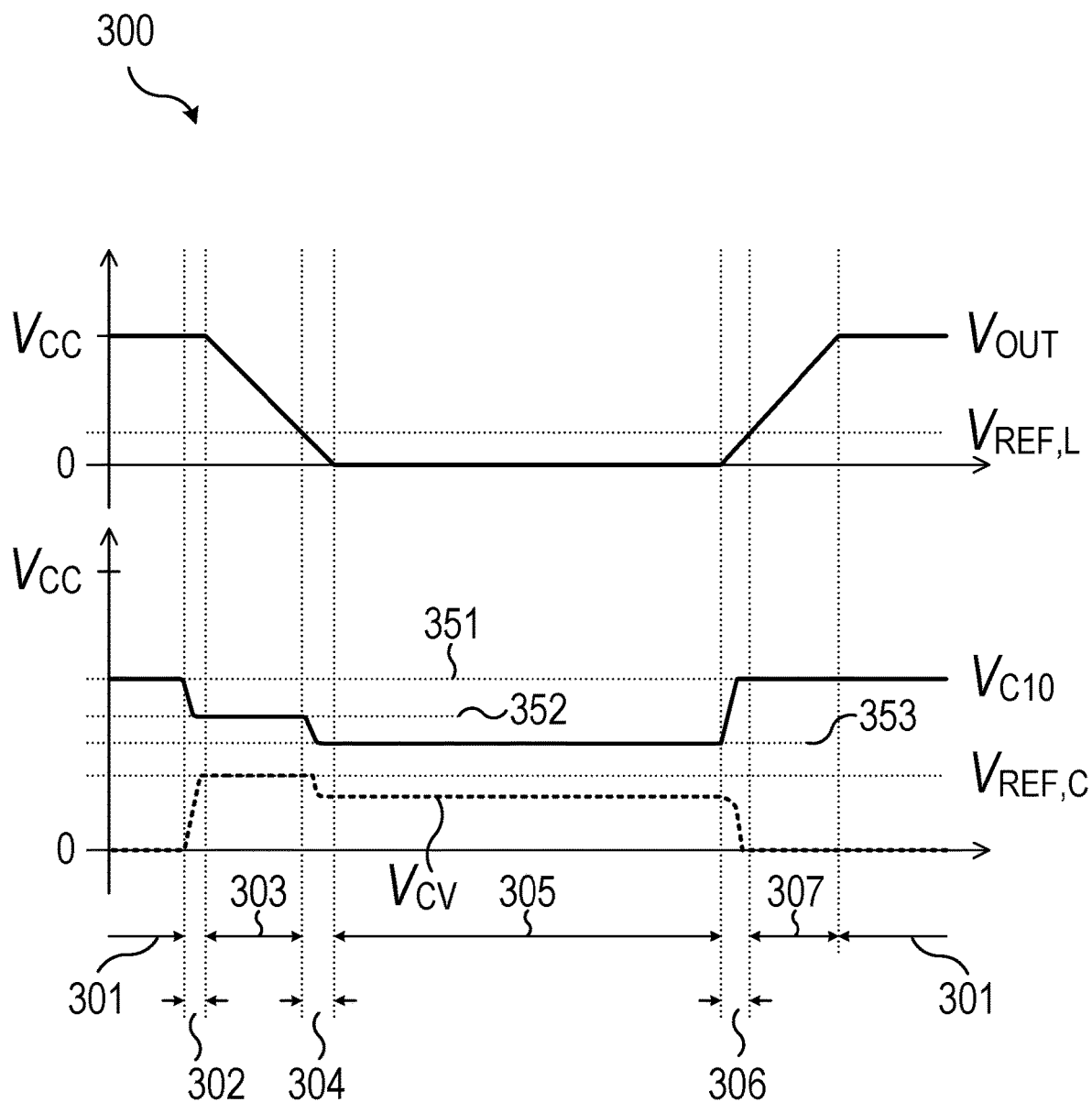
FIG. 3 illustrates an example qualitative timing diagram depicting operation of a half buffer circuit usable in an output buffer circuit in accordance with an embodiment of the invention.

FIG. 3 illustrates an example qualitative timing diagram depicting operation of a half buffer circuit usable in an output buffer circuit in accordance with an embodiment of the invention. The timing diagram of FIG. 3 may qualitatively represent the operation of the embodiment half buffer circuits as described herein, such as the half buffer circuit of FIG. 1, for example.

Referring to FIG. 3, a timing diagram 300 qualitatively relates the output voltage $V_{OUT}$ of a half buffer circuit (top graph) to the feedback capacitor voltage $V_{C10}$ and the control voltage $V_{CV}$ of the half buffer circuit (bottom graph). The control voltage $V_{CV}$ is the voltage at the control input of the output device of the half buffer circuit. The x-axes of the graphs represent time as the half buffer circuit progresses through several states in response to an input voltage $V_{IN}$.

In order to generate the output voltage $V_{OUT}$ the half buffer circuit receives an input voltage $V_{IN}$. The timing diagram 300 corresponds with a negative-slewing half buffer circuit that is initially in the off state 301 during which the output voltage $V_{OUT}$ is at a logical high signal voltage. The logical high signal voltage may be the supply voltage $V_{CC}$ as shown, but may also be any other suitable value.

During the off state 301, the feedback capacitor voltage $V_{C10}$ is at a first partially charged steady voltage 351 that is less than the supply voltage $V_{CC}$ and the control voltage $V_{CV}$ is low (e.g., 0 V as shown). At an instant near the end of the off state 301, the input voltage $V_{IN}$ is changed from the logical high signal voltage to a logical low signal voltage. The logical low signal voltage may be a ground voltage at 0 V as shown or may be any other suitable voltage such as another reference voltage that is less than the logical high signal voltage.

The input voltage $V_{IN}$ at the logical low signal voltage triggers the half buffer circuit to change from the off state 301 to a precharge state 302 during which the control input is charged by the feedback capacitor. Accordingly, the feedback capacitor voltage $V_{C10}$ decreases to a second partially charged steady voltage 352 while the control voltage $V_{CV}$ increases to a reference control voltage $V_{REF,C}$. The second partially charged steady voltage 352 may be related to the reference control voltage $V_{REF,C}$ by a constant offset voltage. For example, the second partially charged steady voltage 352 may be equal to the reference control voltage $V_{REF,C}$ plus the threshold voltage $V_{th}$ of the output device. The output device is turned on by the reference control voltage $V_{REF,C}$ and the half buffer circuit enters a slewing state that includes a main slewing state 303 followed by an overflow slewing state 304. During the slewing state, the output voltage $V_{OUT}$ decreases from the logical high signal voltage to the logical low signal voltage.

The reference control voltage $V_{REF,C}$ controls the slew rate of the half buffer circuit during the slewing state by regulating the current through the output device. The capacitance of the feedback capacitor $C_{10}$ is tailored to appropriately select the reference control voltage $V_{REF,C}$ to be a value which keeps the circuit in its operating region once the parasitic capacitance $C_N$ is known. For example, allowing $C_{10}$ to be the capacitance of the feedback capacitor and $C_N$ be the parasitic capacitance of the output device, the reference control voltage $V_{REF,C}$ can be represented by the following equation.

$$V_{REF,C} = V_{CC}\left(\frac{C_{10}}{C_{10} + C_N}\right)$$

The resulting slew rate can be written in terms of the capacitance of the feedback capacitor $C_{10}$ and a supply current to the half buffer circuit, represented by $I_s$ as the following equation.

$$\frac{dV_{OUT}}{dt} = \frac{I_S}{C_{10}}$$

Once the output voltage $V_{OUT}$ falls below a reference voltage $V_{REF,L}$, the overflow switch is turned on and the half buffer circuit moves from the main slewing state 303 to the overflow slewing state 304 during which excess current is diverted to the ground connection through the overflow switch. Both the output voltage $V_{OUT}$ and the control voltage $V_{CV}$ may decrease further as the current is drawn away from both the feedback capacitor and the control input. For example, the output voltage $V_{OUT}$ may decrease to a third partially charged steady voltage 353 (e.g., due to the charge injection during current-steering) that is also greater than the ground voltage. In one embodiment, both the output voltage $V_{OUT}$ and the control voltage $V_{CV}$ decrease by the same amount and the constant voltage difference (e.g. the threshold voltage $V_{th}$) remains the same after the voltage decrease.

After the output voltage $V_{OUT}$ has reached the logical low signal voltage, the slewing state ends and the half buffer circuit enters the on state 305. During the on state 305, the input voltage $V_{IN}$ and the output voltage $V_{OUT}$ are both at the logical low signal voltage (e.g. 0 V) and the output voltage $V_{OUT}$ and the control voltage $V_{CV}$ are both substantially constant at voltage levels between the ground voltage and the supply voltage $V_{CC}$.

If the input voltage $V_{IN}$ is then returned back to the logical high signal voltage, the half buffer circuit enters a resetting state that includes a post-charge state 306 followed by a pre-off state 307. During the post-charge state 306, the control voltage $V_{CV}$ is discharged to the ground voltage and the feedback capacitor voltage $V_{C10}$ is charged back to the first partially charged steady voltage 351 at which time the output voltage $V_{OUT}$ surpasses the reference voltage $V_{REF,L}$. The overflow switch is turned off by the output voltage $V_{OUT}$ and the half buffer circuit moves into a pre-off state 307 while the output slewing is controlled by another half buffer circuit (i.e. a positive-slewing half buffer circuit). The feedback capacitor voltage $V_{C10}$ and the control voltage $V_{CV}$ are similar in the pre-off state 307 as in the off state 301 which the half buffer circuit has returned to once the output voltage $V_{OUT}$ reaches the logical high signal voltage.

As illustrated in the timing diagram 300, the feedback capacitor voltage $V_{C10}$ is advantageously never fully charged or discharged during a cycle of the half buffer circuit from the off state 301 to the on state 305 and back to the off state 301. The reduced charge transfer from the feedback capacitor during commutation advantageously reduces the input/output delay of the half buffer circuit. Further, the insensitivity of the slew rate to capacitance loading and supply voltage variation may also be beneficially maintained.

Figure 4:
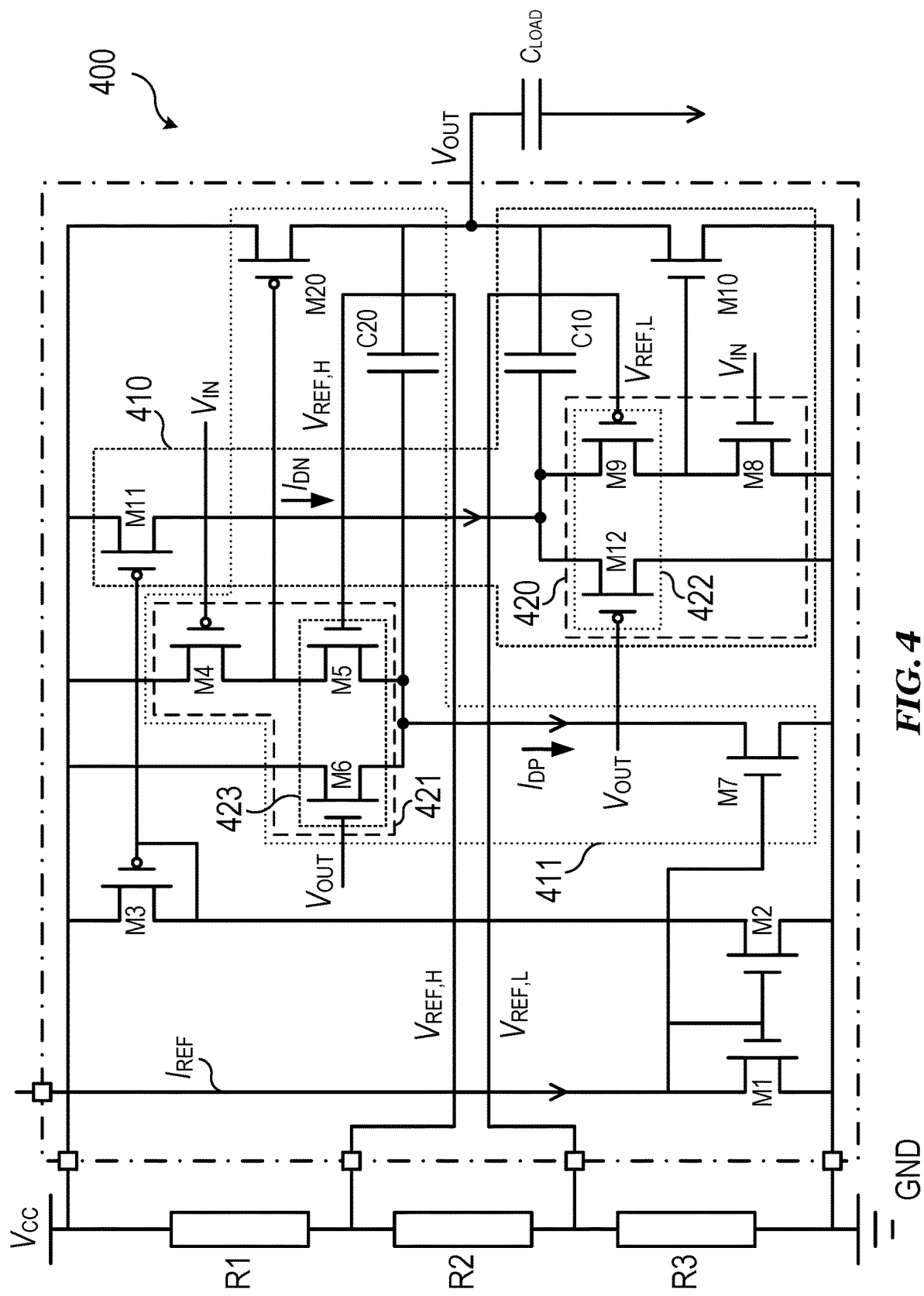
FIG. 4 illustrates a schematic circuit diagram of an example CMOS output buffer circuit including a negative-slewing half buffer circuit and a positive-slewing half buffer circuit in accordance with an embodiment of the invention.

FIG. 4 illustrates a schematic circuit diagram of an example CMOS output buffer circuit including a negative-slewing half buffer circuit and a positive-slewing half buffer circuit in accordance with an embodiment of the invention. The negative-slewing half buffer circuit and the positive-slewing half buffer circuit of FIG. 4 may be specific implementations of other half buffer circuits described herein such as the half buffer circuit of FIG. 1, for example.

Referring to FIG. 4, a half buffer circuit 400 includes a negative-slewing half buffer circuit 410 and a positive-slewing half buffer circuit 411 and is supplied by a supply voltage $V_{CC}$ and a ground voltage GND. The supply voltage $V_{CC}$ may be partitioned into a high reference voltage $V_{REF,H}$ and a low reference voltage $V_{REF,L}$ by a first resistance R1, a second resistance R2, and a third resistance R3. The half buffer circuit 400 is configured to output an output voltage $V_{OUT}$ coupled to a capacitive load $C_{LOAD}$.

A reference current $I_{REF}$ may be supplied to a first mirror including three n-type transistors M1, M2, and M7 which supply the positive-slewing half buffer circuit 411 with a positive-slewing drain current $I_{DP}$ through M7. Accordingly, M7 may be considered a current source for the positive-slewing half buffer circuit 411. A current is supplied by M2 to a second current mirror including two p-type transistors M3 and M11. The negative-slewing half buffer circuit 410 is supplied by a negative-slewing drain current $I_{DN}$ by M11 which may be considered a current source for the negative-slewing half buffer circuit 410. Alternatively, separate supply current may be provided to the negative-slewing half buffer circuit 410 and the positive-slewing half buffer circuit 411 rather than including M2 in the first current mirror.

The negative-slewing half buffer circuit 410 may be a substantially similar or identical to the negative-slewing half buffer circuit 210 of FIG. 2. The negative-slewing half buffer circuit 410 includes a negative-slewing switch network 420, a negative-slewing feedback capacitor C10, and an n-type output transistor M10. The negative-slewing switch network 420 includes an n-type transistor M8 and a differential pair of transistors 422 including two p-type transistors M9 and M12. An input voltage $V_{IN}$ is coupled to the gate of M8, the low reference voltage $V_{REF,L}$ is coupled to the gate of M9, and the output voltage $V_{OUT}$ is coupled to the gate of M12.

Similarly, the positive-slewing half buffer circuit 411 may be a specific implementation of the half buffer circuit no of FIG. 1 with the direction of the supply voltage reversed and the ground connection replaced with the supply voltage $V_{CC}$. The positive-slewing half buffer circuit 411 includes a positive-slewing switch network 421, a positive-slewing feedback capacitor C20, and a p-type output transistor M20. The positive-slewing switch network 421 includes a p-type transistor M4 and a differential pair of transistors 423 including two n-type transistors M5 and M6. An input voltage $V_{IN}$ is coupled to the gate of M4, the high reference voltage $V_{REF,H}$ is coupled to the gate of M5, and the output voltage $V_{OUT}$ is coupled to the gate of M6.

Figure 5:
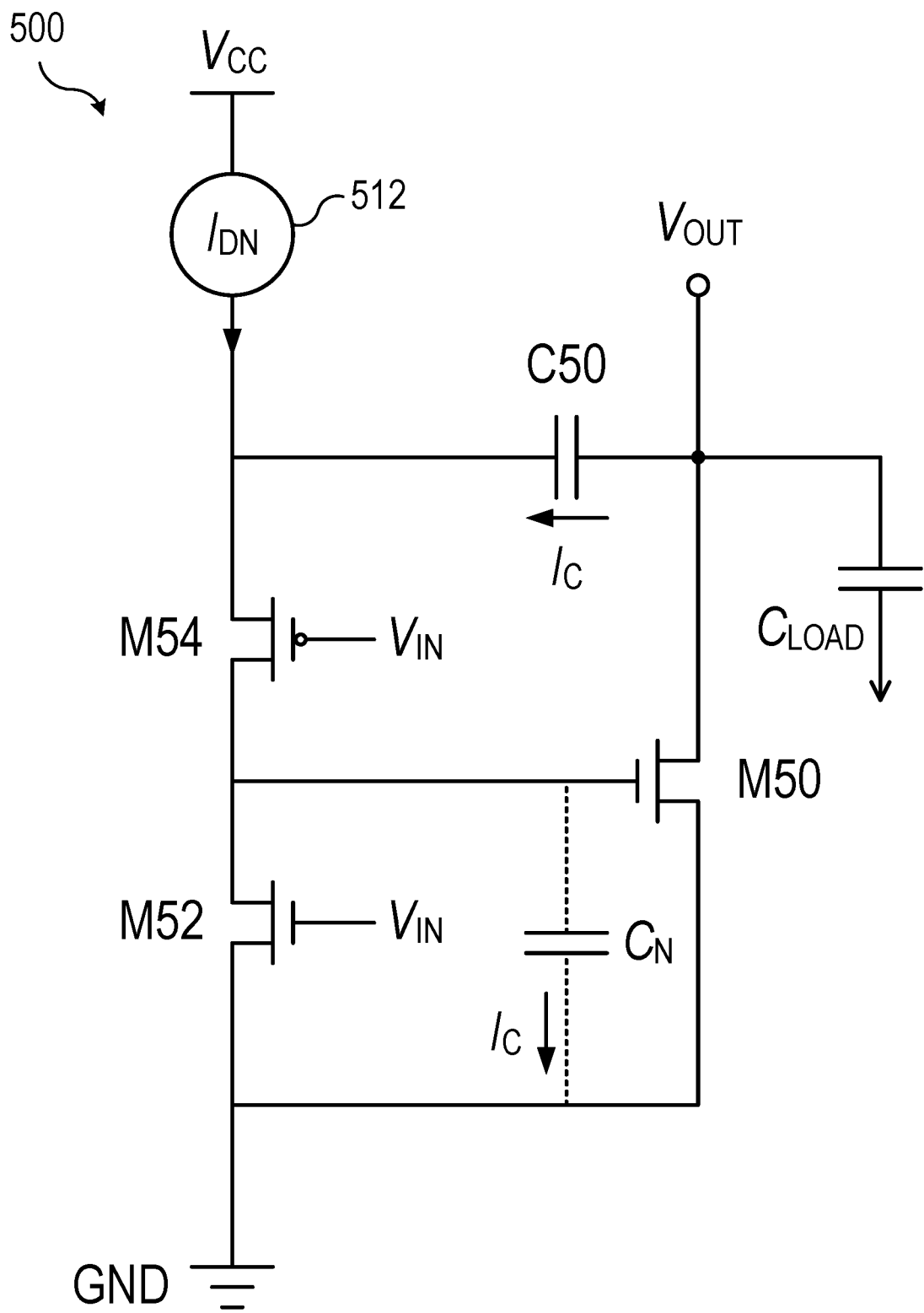
FIG. 5 illustrates a conventional CMOS negative-slewing half buffer circuit.

In order to contrast embodiment output buffer circuits and embodiment half buffer circuits described herein, a conventional CMOS negative-slewing half buffer circuit is discussed in the following. FIG. 5 illustrates a conventional CMOS negative-slewing half buffer circuit while FIG. 6 illustrates a conventional timing diagram of the conventional CMOS negative-slewing half buffer circuit of FIG. 5.

Figure 6:
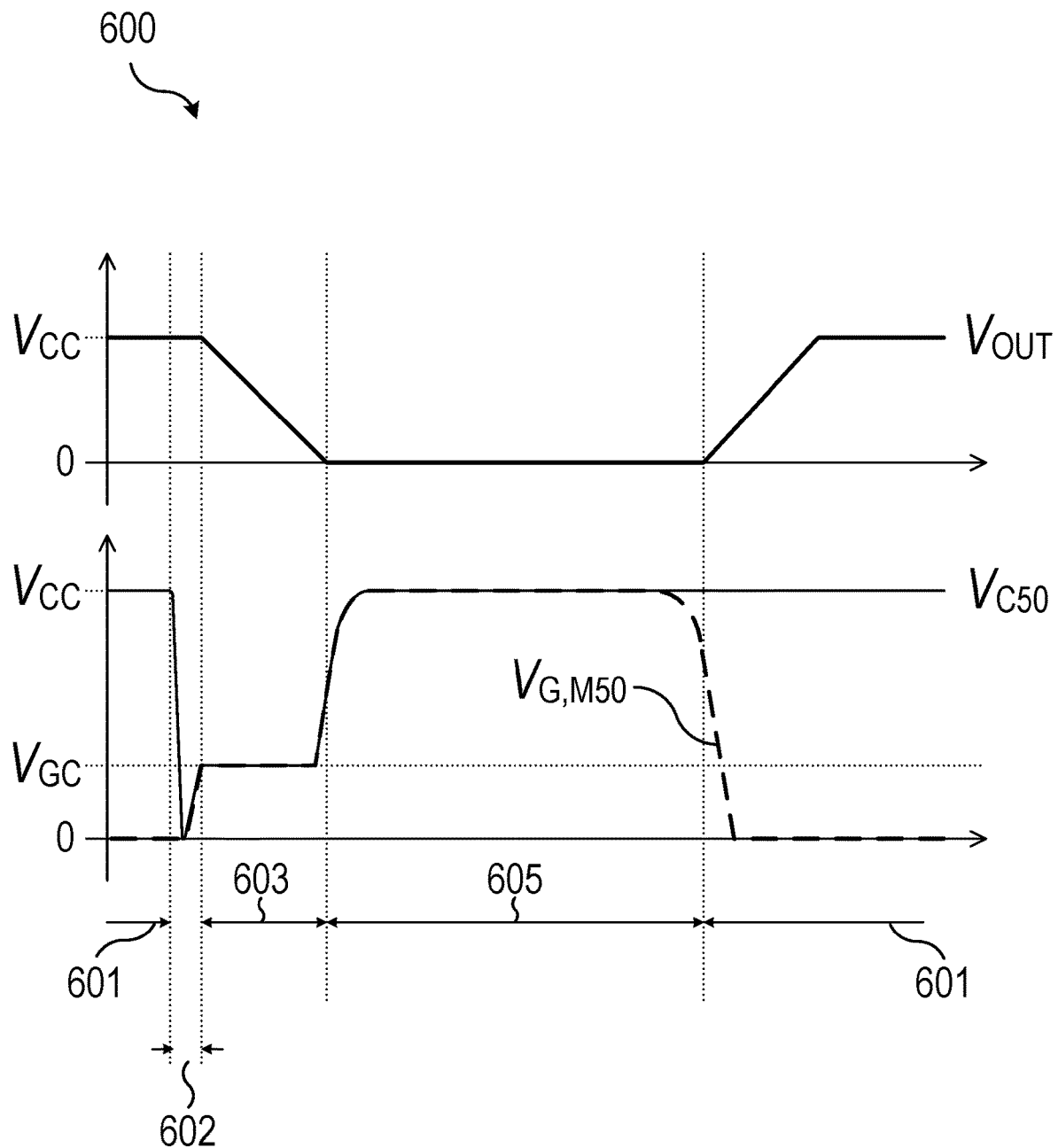
FIG. 6 illustrates a conventional timing diagram of the conventional CMOS negative-slewing half buffer circuit of FIG. 5.

Referring to FIGS. 5 and 6, a conventional CMOS negative-slewing half buffer circuit 500 includes a p-type MOSFET M54 coupled between a current source 512 and the gate of an n-type MOSFET M50. A capacitor C50 is coupled between the current source 512 and the drain of the n-type MOSFET M50. An output voltage $V_{OUT}$ and a capacitive load $C_{LOAD}$ are also coupled to the drain of the n-type MOSFET M50. An n-type MOSFET M52 is coupled between the gate of the n-type MOSFET M50 and a ground voltage GND. The gate-source capacitance of the n-type MOSFET M50 is represented by the capacitance $C_N$.

In contrast to embodiment output buffer circuits and embodiment half buffer circuits described herein, the conventional CMOS negative-slewing half buffer circuit 500 includes only one current path for the supplied current $I_{DN}$ to travel from the current source 512 to the ground voltage GND. In particular, there is only one voltage used to control the conventional CMOS negative-slewing half buffer circuit 500: the input voltage $V_{IN}$ which is coupled to both the gates of M52 and M54. Consequently, M54 is open when M52 is closed and vice versa.

The result can be seen in the conventional timing diagram 600 in which the capacitor voltage $V_{C50}$ is fully charged at the supply voltage $V_{CC}$ in a conventional off state 601, fully discharges to the ground voltage GND (o V) and then charges to the gate reference voltage $V_{GC}$ in a conventional precharge state 602, holds constant during the conventional slewing state 603, and then charges back up to the supply voltage $V_{CC}$ in the conventional on state 605. The gate voltage of M50 $V_{G,M50}$ is the same as the capacitor voltage $V_{C50}$ through the conventional slewing state 603 and the on state 605 and then is fully discharged in the off state 601. This complete charging and discharging of the capacitor C50 disadvantageously increases input/output delay of the conventional CMOS negative-slewing half buffer circuit 500.

Example embodiments of the invention are summarized here. Other embodiments can also be understood from the entirety of the specification as well as the claims filed herein.

Example 1

A half buffer circuit comprising: current source coupled to a first node; ground connection coupled to a second node; feedback capacitor coupled between the first node and an output of the half buffer circuit; transconductor element comprising a first input/output, a second input/output, and a transconductor element control input, the first input/output being coupled to the output of the half buffer circuit, and the second input/output being coupled to a ground connection; and switch network coupled between the first node and the second node, the switch network comprising: first switch coupled between the first node and the second node, second switch coupled between the first node and the transconductor element control input, and third switch coupled between the second node and the transconductor element control input.

Example 2

The half buffer circuit of example 1, wherein: the first switch comprises a first switch control input coupled to the output of the half buffer circuit; and the third switch comprises a third switch control input coupled to an input of the half buffer circuit.

Example 3

The half buffer circuit of one of examples 1 and 2, wherein: the first switch is configured to be closed when the output of the half buffer circuit outputs a logical low signal; the third switch is configured to be closed when an input of the half buffer circuit receives a logical high signal; and the half buffer circuit is a negative-slewing half buffer circuit.

Example 4

The half buffer circuit of one of examples 1 to 3, wherein: the first switch is configured to be closed when the output of the half buffer circuit outputs a logical high signal; the third switch is configured to be closed when an input of the half buffer circuit receives a logical low signal; and the half buffer circuit is a positive-slewing half buffer circuit.

Example 5

The half buffer circuit of one of examples 1 to 4, wherein: the first switch comprises a first transistor; the second switch comprises a second transistor; and the switch network further comprises a differential pair of transistors comprising the first transistor and the second transistor.

Example 6

The half buffer circuit of one of examples 1 to 5, wherein the switch network is configured to: charge the feedback capacitor to a first partially charged steady state when the output of the half buffer circuit outputs a logical high signal voltage; and charge the feedback capacitor to a second partially charged steady state when the output of the half buffer circuit outputs a logical low signal.

Example 7

The half buffer circuit of example 6, wherein: the first partially charged steady state is greater than the second partially charged steady state; and the half buffer circuit is a negative-slewing half buffer circuit.

Example 8

The half buffer circuit of example 6, wherein: the first partially charged steady state is less than the second partially charged steady state; and the half buffer circuit is a positive-slewing half buffer circuit.

Example 9

An output buffer circuit comprising: first input node; n output node; negative-slewing half buffer circuit coupled between a current source and a ground connection, the negative-slewing half buffer circuit comprising first output transistor coupled to the output node, first feedback capacitor coupled to the output node, and first switch network comprising a first current path between the current source and the ground connection, and a second current path between the current source and the ground connection; and therein the first current path is configured to allow current to flow when the first input node receives a logical high signal voltage; and therein the second current path is configured to allow current to flow when the output node outputs a logical low signal voltage.

Example 10

The output buffer circuit of example 9, further comprising: positive-slewing half buffer circuit coupled between the current source and the ground connection, the positive-slewing half buffer circuit comprising second output transistor coupled to the output node, second feedback capacitor coupled to the output node, and second switch network comprising a third current path between the current source and the ground connection, and a fourth current path between the current source and the ground connection; and therein the third current path is configured to allow current to flow when the first input node receives a voltage that is the logical low signal voltage; and therein the fourth current path is configured to allow current to flow when the output node outputs the logical high signal voltage.

Example 11

The output buffer circuit of example 10, further comprising: second input node coupled to the first current path, the second current path being further configured to allow current to flow when the output node outputs a voltage that is less than a voltage received by the second input node; and third input node coupled to the third current path, the fourth current path being further configured to allow current to flow when the output node outputs a voltage that is greater than a voltage received by the third input node.

Example 12

The output buffer circuit of example 11, wherein: the second input node is configured to receive a first reference voltage comprising a first constant voltage between about 10% and about 40% of the logical high signal voltage; and the third input node is configured to receive a second reference voltage comprising a second constant voltage between about 60% and about 90% of the logical high signal voltage.

Example 13

The output buffer circuit of one of examples 9 to 12, wherein: the first switch network further comprises n n-type transistor comprising a first gate coupled to the first input node; differential pair of transistors comprising a first p-type transistor and a second p-type transistor, the first current path including the first p-type transistor and the second current path including the second p-type transistor; the first p-type transistor comprises a second gate coupled to a reference voltage greater than the logical low signal voltage and less than the logical high signal voltage; the second p-type transistor comprises a third gate coupled to the output node; and the second current path is further configured to allow current to flow when the output node outputs a voltage that is less than the reference voltage.

Example 14

The output buffer circuit of one of examples 9 to 13, wherein the first switch network is configured to: charge the first feedback capacitor to a first partially charged steady state when the output node outputs the logical high signal voltage; and charge the first feedback capacitor to a second partially charged steady state when the output node outputs the logical low signal voltage.

Example 15

A method of operating an output buffer circuit, the method comprising: providing a logical high signal voltage to a first switch network of a negative-slewing half buffer circuit of the output buffer circuit; partially charging a first feedback capacitor of the negative-slewing half buffer circuit to a first partially charged steady state voltage using a supply voltage and in response to providing the logical high signal voltage to the first switch network, the first partially charged steady state voltage being less than the supply voltage; outputting the logical high signal voltage at an output of the output buffer circuit after providing the logical high signal voltage; witching the logical high signal voltage at the first switch network to a logical low signal voltage; partially discharging the first feedback capacitor to a second partially charged steady state voltage in response to switching the logical high signal voltage at the first switch network to the logical low signal voltage, the second partially charged steady state voltage being greater than a ground voltage; and outputting the logical low signal voltage at the output of the output buffer circuit after switching the logical high signal voltage to the logical low signal voltage.

Example 16

The method of example 15, further comprising: providing the logical low signal voltage to a second switch network of a positive-slewing half buffer circuit of the output buffer circuit; partially discharging a second feedback capacitor of the positive-slewing half buffer circuit to a third partially charged steady state voltage in response to providing the logical low signal voltage to the second switch network, the third partially charged steady state voltage being greater than the ground voltage; outputting the logical low signal voltage at an output of the output buffer circuit after providing the logical low signal voltage; witching the logical low signal voltage at the second switch network to the logical high signal voltage; partially charging the second feedback capacitor to a fourth partially charged steady state voltage using the supply voltage and in response to switching the logical low signal voltage at the second switch network to the logical high signal voltage, the second partially charged steady state voltage being less than the supply voltage; and outputting the logical high signal voltage at the output of the output buffer circuit after switching the logical low signal voltage to the logical high signal voltage.

Example 17

The method of one of examples 15 and 16, wherein partially charging the first feedback capacitor comprises: providing the output of the output buffer circuit to an overflow switch of the first switch network as an overflow voltage; providing the logical high signal voltage to a transition switch of the first switch network to turn on the transition switch; providing a constant reference voltage to a flow control switch of the first switch network to turn on the flow control switch, the constant reference voltage being greater than the ground voltage and less than the supply voltage; partially charging the first feedback capacitor through the flow control switch using a gate voltage of an output transistor of the output buffer circuit; and prohibiting current flow through the overflow switch in response to the overflow voltage exceeding the constant reference voltage.

Example 18

The method of one of examples 15 to 17, wherein partially discharging the first feedback capacitor comprises: initiating a precharge state of the output buffer circuit in response to switching the logical high signal voltage at the first switch network to the logical low signal voltage and during which current flows from the first feedback capacitor to a control input of an output device of the output buffer circuit so that the output device is turned on; initiating a slewing state of the output buffer circuit in response to the output device being turned on and during which the output buffer circuit is outputting a constantly decreasing slewing voltage at the output; and diverting current from the control input to an overflow switch during the slewing state and in response to the output buffer circuit outputting a voltage lower than a reference voltage so that the first feedback capacitor partially discharges to the second partially charged steady voltage.

Example 19

The method of one of examples 15 to 18, wherein partially discharging the first feedback capacitor comprises: partially discharging the first feedback capacitor from the first partially charged steady voltage to a third partially charged steady voltage during a precharge state of the output buffer circuit; and partially discharging the first feedback capacitor from the third partially charged steady voltage to the second partially charged steady voltage in response to the output buffer circuit outputting a voltage lower than a reference voltage.

Example 20

The method of example 19, wherein the third partially charged steady voltage is equal to a reference control voltage at a control input of an output device of the output buffer circuit plus a threshold voltage of the output device.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A half buffer circuit comprising:
a current source coupled to a first node;
a ground connection coupled to a second node;
a feedback capacitor coupled between the first node and an output of the half buffer circuit;
a transconductor element comprising a first input/output, a second input/output, and a transconductor element control input, the first input/output being coupled to the output of the half buffer circuit, and the second input/output being coupled to a ground connection; and
a switch network coupled between the first node and the second node, the switch network comprising:
a first switch coupled between the first node and the second node,
a second switch coupled between the first node and the transconductor element control input, and
a third switch coupled between the second node and the transconductor element control input.

2. The half buffer circuit of claim 1, wherein:
the first switch comprises a first switch control input coupled to the output of the half buffer circuit; and
the third switch comprises a third switch control input coupled to an input of the half buffer circuit.

3. The half buffer circuit of claim 1, wherein:
the first switch is configured to be closed when the output of the half buffer circuit outputs a logical low signal;
the third switch is configured to be closed when an input of the half buffer circuit receives a logical high signal; and
the half buffer circuit is a negative-slewing half buffer circuit.

4. The half buffer circuit of claim 1, wherein:
the first switch is configured to be closed when the output of the half buffer circuit outputs a logical high signal;
the third switch is configured to be closed when an input of the half buffer circuit receives a logical low signal; and
the half buffer circuit is a positive-slewing half buffer circuit.

5. The half buffer circuit of claim 1, wherein:
the first switch comprises a first transistor;
the second switch comprises a second transistor; and
the switch network further comprises a differential pair of transistors comprising the first transistor and the second transistor.

6. The half buffer circuit of claim 1, wherein the switch network is configured to:
charge the feedback capacitor to a first partially charged steady state when the output of the half buffer circuit outputs a logical high signal voltage; and
charge the feedback capacitor to a second partially charged steady state when the output of the half buffer circuit outputs a logical low signal.

7. The half buffer circuit of claim 6, wherein:
the first partially charged steady state is greater than the second partially charged steady state; and
the half buffer circuit is a negative-slewing half buffer circuit.

8. The half buffer circuit of claim 6, wherein:
the first partially charged steady state is less than the second partially charged steady state; and
the half buffer circuit is a positive-slewing half buffer circuit.

9. An output buffer circuit comprising:
a first input node;
an output node;
a negative-slewing half buffer circuit coupled between a current source and a ground connection, the negative-slewing half buffer circuit comprising
a first output transistor coupled to the output node,
a first feedback capacitor coupled to the output node, and
a first switch network comprising a first current path between the current source and the ground connection, and a second current path between the current source and the ground connection; and
wherein the first current path is configured to allow current to flow when the first input node receives a logical high signal voltage; and
wherein the second current path is configured to allow current to flow when the output node outputs a logical low signal voltage.

10. The output buffer circuit of claim 9, further comprising:
a positive-slewing half buffer circuit coupled between the current source and the ground connection, the positive-slewing half buffer circuit comprising
a second output transistor coupled to the output node,
a second feedback capacitor coupled to the output node, and
a second switch network comprising a third current path between the current source and the ground connection, and a fourth current path between the current source and the ground connection; and
wherein the third current path is configured to allow current to flow when the first input node receives a voltage that is the logical low signal voltage; and
wherein the fourth current path is configured to allow current to flow when the output node outputs the logical high signal voltage.

11. The output buffer circuit of claim 10, further comprising:
a second input node coupled to the first current path, the second current path being further configured to allow current to flow when the output node outputs a voltage that is less than a voltage received by the second input node; and
a third input node coupled to the third current path, the fourth current path being further configured to allow current to flow when the output node outputs a voltage that is greater than a voltage received by the third input node.

12. The output buffer circuit of claim 11, wherein:
the second input node is configured to receive a first reference voltage comprising a first constant voltage between about 10% and about 40% of the logical high signal voltage; and
the third input node is configured to receive a second reference voltage comprising a second constant voltage between about 60% and about 90% of the logical high signal voltage.

13. The output buffer circuit of claim 9, wherein:
the first switch network further comprises
an n-type transistor comprising a first gate coupled to the first input node;
a differential pair of transistors comprising a first p-type transistor and a second p-type transistor, the first current path including the first p-type transistor and the second current path including the second p-type transistor;
the first p-type transistor comprises a second gate coupled to a reference voltage greater than the logical low signal voltage and less than the logical high signal voltage;
the second p-type transistor comprises a third gate coupled to the output node; and
the second current path is further configured to allow current to flow when the output node outputs a voltage that is less than the reference voltage.

14. The output buffer circuit of claim 9, wherein the first switch network is configured to:
charge the first feedback capacitor to a first partially charged steady state when the output node outputs the logical high signal voltage; and
charge the first feedback capacitor to a second partially charged steady state when the output node outputs the logical low signal voltage.

15. A method of operating an output buffer circuit, the method comprising:
providing a logical high signal voltage to a first switch network of a negative-slewing half buffer circuit of the output buffer circuit;
partially charging a first feedback capacitor of the negative-slewing half buffer circuit to a first partially charged steady state voltage using a supply voltage and in response to providing the logical high signal voltage to the first switch network, the first partially charged steady state voltage being less than the supply voltage;
outputting the logical high signal voltage at an output of the output buffer circuit after providing the logical high signal voltage;
switching the logical high signal voltage at the first switch network to a logical low signal voltage;

partially discharging the first feedback capacitor to a second partially charged steady state voltage in response to switching the logical high signal voltage at the first switch network to the logical low signal voltage, the second partially charged steady state voltage being greater than a ground voltage; and outputting the logical low signal voltage at the output of the output buffer circuit after switching the logical high signal voltage to the logical low signal voltage.

16. The method of claim 15, further comprising:

providing the logical low signal voltage to a second switch network of a positive-slewing half buffer circuit of the output buffer circuit;

partially discharging a second feedback capacitor of the positive-slewing half buffer circuit to a third partially charged steady state voltage in response to providing the logical low signal voltage to the second switch network, the third partially charged steady state voltage being greater than the ground voltage;

outputting the logical low signal voltage at an output of the output buffer circuit after providing the logical low signal voltage;

switching the logical low signal voltage at the second switch network to the logical high signal voltage;

partially charging the second feedback capacitor to a fourth partially charged steady state voltage using the supply voltage and in response to switching the logical low signal voltage at the second switch network to the logical high signal voltage, the second partially charged steady state voltage being less than the supply voltage; and outputting the logical high signal voltage at the output of the output buffer circuit after switching the logical low signal voltage to the logical high signal voltage.

17. The method of claim 15, wherein partially charging the first feedback capacitor comprises:

providing the output of the output buffer circuit to an overflow switch of the first switch network as an overflow voltage;

providing the logical high signal voltage to a transition switch of the first switch network to turn on the transition switch;

providing a constant reference voltage to a flow control switch of the first switch network to turn on the flow control switch, the constant reference voltage being greater than the ground voltage and less than the supply voltage;

partially charging the first feedback capacitor through the flow control switch using a gate voltage of an output transistor of the output buffer circuit; and prohibiting current flow through the overflow switch in response to the overflow voltage exceeding the constant reference voltage.

18. The method of claim 15, wherein partially discharging the first feedback capacitor comprises:

initiating a precharge state of the output buffer circuit in response to switching the logical high signal voltage at the first switch network to the logical low signal voltage and during which current flows from the first feedback capacitor to a control input of an output device of the output buffer circuit so that the output device is turned on;

initiating a slewing state of the output buffer circuit in response to the output device being turned on and during which the output buffer circuit is outputting a constantly decreasing slewing voltage at the output; and diverting current from the control input to an overflow switch during the slewing state and in response to the output buffer circuit outputting a voltage lower than a reference voltage so that the first feedback capacitor partially discharges to the second partially charged steady voltage.

19. The method of claim 15, wherein partially discharging the first feedback capacitor comprises:

partially discharging the first feedback capacitor from the first partially charged steady voltage to a third partially charged steady voltage during a precharge state of the output buffer circuit; and partially discharging the first feedback capacitor from the third partially charged steady voltage to the second partially charged steady voltage in response to the output buffer circuit outputting a voltage lower than a reference voltage.

20. The method of claim 19, wherein the third partially charged steady voltage is equal to a reference control voltage at a control input of an output device of the output buffer circuit plus a threshold voltage of the output device.

* * * * *